United States Patent
Kawanami et al.

(10) Patent No.: US 7,670,941 B2
(45) Date of Patent: Mar. 2, 2010

(54) METHOD FOR PRODUCTION OF SEMICONDUCTOR DEVICES

(75) Inventors: Koji Kawanami, Nagasaki (JP); Kiyotaka Tabuchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 80 days.

(21) Appl. No.: 11/465,502

(22) Filed: Aug. 18, 2006

(65) Prior Publication Data

US 2007/0048995 A1   Mar. 1, 2007

(30) Foreign Application Priority Data

Aug. 31, 2005   (JP) .......................... P2005-250614

(51) Int. Cl.
*H01L 21/00* (2006.01)
(52) U.S. Cl. ..................... 438/618; 438/627; 438/658; 438/687; 438/720; 257/E21.171; 257/E21.304; 257/E21.576; 257/E21.582; 257/E21.593; 257/E23.145; 257/E23.167
(58) Field of Classification Search ................. 438/660, 438/680, 618, 622, 637, 640, 658, 663, 666, 438/669, 672, 687, 701, 720, 742; 257/E21.268, 257/269, 304, 311, 576, 582, 583
See application file for complete search history.

(56) References Cited

U.S. PATENT DOCUMENTS

| | | | | |
|---|---|---|---|---|
| 6,040,240 A | * | 3/2000 | Matsubara | .................. 438/618 |
| 6,528,415 B2 | * | 3/2003 | Pyo | ............................. 438/639 |
| 6,716,749 B2 | * | 4/2004 | Noguchi et al. | ............. 438/677 |
| 6,790,774 B2 | * | 9/2004 | Fujikawa et al. | ............ 438/660 |
| 6,818,546 B2 | * | 11/2004 | Saito et al. | .................. 438/618 |
| 6,838,772 B2 | * | 1/2005 | Saitoh et al. | ................ 257/758 |
| 6,890,846 B2 | * | 5/2005 | Noguchi | ..................... 438/622 |
| 2002/0048949 A1 | * | 4/2002 | Pyo | ............................. 438/687 |
| 2004/0023485 A1 | * | 2/2004 | Pan et al. | .................... 438/637 |
| 2004/0121582 A1 | * | 6/2004 | Lee | ............................. 438/622 |
| 2006/0046479 A1 | * | 3/2006 | Rajagopalan et al. | ....... 438/683 |
| 2009/0001586 A1 | * | 1/2009 | Farrar | ......................... 257/751 |

FOREIGN PATENT DOCUMENTS

JP   2003-188254   7/2003

* cited by examiner

*Primary Examiner*—Michael S Lebentritt
(74) *Attorney, Agent, or Firm*—Sonnenschein Nath & Rosenthal LLP

(57) ABSTRACT

A method for production of semiconductor devices which includes the steps of forming, on an interlayer insulating film formed on a substrate, a copper-containing conductive layer in such a way that its surface is exposed, performing heat treatment with a reducing gas composed mainly of hydrogen on the surface of the conductive layer, performing plasma treatment with a reducing gas on the surface of the conductive layer, thereby permitting the surface of the conductive layer to be reduced and the hydrogen adsorbed by the heat treatment to be released, and forming an oxidation resistance film that covers the surface of the conductive layer such that the surface of the conductive layer is not exposed to an oxygen-containing atmospheric gas after the plasma treatment.

3 Claims, 5 Drawing Sheets

METHOD FOR PRODUCTION OF SEMICONDUCTOR DEVICES

CROSS REFERENCES TO RELATED APPLICATIONS

The present invention contains subject matter related to Japanese Patent Application JP 2005-250614 filed in the Japanese Patent Office on Aug. 31, 2005, the entire contents of which being incorporated herein by reference.

BACKGROUND OF THE INVENTION

1. Field of the Invention

The present invention relates to a method for production of semiconductor devices which permits easy removal of native oxide with a minimum damage to the substrate.

2. Description of the Related Art

Plasma treatment has been a common practice in the past technology. It alters the treated layer only slightly with very little adverse effect on reliability and working speed so long as it is performed on the wiring section of large area. However, this does not hold true any longer as the result of recent miniaturization of semiconductor devices, particularly in wiring. Reduced wiring width, increased current density, and multilayer structure require better reliability. An increase in current density is accomplished by employing a conducting film composed mainly of copper which has a low resistance as well as a thin interlayer insulating film with a low dielectric constant. The process for forming an interlayer insulting film on a conducting film composed mainly of copper involves a step of removing native oxide from the conducting film. This step is accomplished by plasma treatment in a reducing gas typified by hydrogen and ammonia. This technique is disclosed in Japanese Patent Laid-Open No. 2003-188254.

Unfortunately, any interlayer insulating film with a low dielectric constant usually suffers from low density and poor mechanical strength. Consequently, plasma treatment with a reducing gas causes the interlayer insulating film to increase in dielectric constant or to recede. On the other hand, chemical treatment without plasma poses a problem with chemical solution remaining on or infiltrating into the insulating film. In order to address these problems, there has recently been proposed a process for annealing in a reducing gas. This process, however, still has many difficulties such as increase in heat amount to be overcome before it is put to practical use.

SUMMARY OF THE INVENTION

The problems for solution by the present invention are as follows: Plasma treatment with a reducing gas, which is performed to remove native oxide from metal wiring composed mainly of copper formed on an interlayer insulating film having a low dielectric constant and hence suffering from low density and poor mechanical properties, causes the interlayer insulating film to increase in dielectric constant or to recede. Chemical treatment without plasma which is performed to remove native oxide causes the chemical solution to remain on or infiltrate into the interlayer insulating film. Annealing with a reducing gas which is performed to remove native oxide needs a large amount of heat and means for avoiding adsorption of reducing gas.

It is desirable to provide a method of removing native oxide, while protecting the wiring from oxidation, with a minimum damage to the interlayer insulating film by using in combination heat treatment with a reducing gas composed mainly of hydrogen and plasma treatment with a reducing gas.

The present invention is directed to a method for production of semiconductor devices which includes the steps of forming, on an interlayer insulating film formed on a substrate, a copper-containing conductive layer in such a way that its surface is exposed, performing heat treatment with a reducing gas composed mainly of hydrogen on the surface of the conductive layer. The method for production of semiconductor devices further includes the steps of performing plasma treatment with a reducing gas on the surface of the conductive layer, thereby permitting the surface of the conductive layer to be reduced and the hydrogen adsorbed by the heat treatment to be released, and forming an oxidation resistance film that covers the surface of the conductive layer such that the surface of the conductive layer is not exposed to an oxygen-containing atmospheric gas after the plasma treatment.

The method for production of semiconductor devices according to an embodiment of the present invention is intended to remove native oxide that has formed on the surface of a conductive layer. The native oxide is removed by performing heat treatment with a reducing gas composed mainly of hydrogen on the surface of a conductive layer and subsequently performing plasma treatment with a reducing gas. The advantage of the two-step method is that the heat treatment for reduction does not need such a large amount of heat as to damage the interlayer insulating film and the conductive layer. In other words, it is not necessary to completely remove native oxide by the heat treatment with a reducing gas composed mainly of hydrogen, because residual native oxide (if there is any) is removed by the subsequent plasma treatment for reduction. In the second step, the hydrogen which has been adsorbed by the heat treatment for reduction is released. Native oxide remaining after the heat treatment for reduction is extremely thin. Consequently, the plasma treatment with a reducing gas to completely remove residual native oxide can be accomplished in a very short time. The plasma treatment in this manner does not cause the low-dielectric insulating film to increase in dielectric constant or to recede. Thus, the method for production of semiconductor devices according to an embodiment of the present invention produces its effect by combination of heat treatment with a reducing gas composed mainly of hydrogen and plasma treatment with a reducing gas. The combination of two steps makes the best use of the advantages of individual steps, while minimizing their disadvantages.

The method for production of semiconductor devices according to an embodiment of the present invention involves heat treatment with a reducing gas composed mainly of hydrogen and plasma treatment with a reducing gas. The two steps combined together completely remove native oxide, without individual steps working harsh. Removal of native oxide in this manner prevents the interlayer insulating film from increasing in dielectric constant and from receding. In addition, plasma treatment with a reducing gas releases hydrogen which has entered the wiring or interlayer insulating film during heat treatment with a hydrogen-based reducing gas. This leads to a decrease in leakage current between wirings. The method of the present invention gives semiconductor devices with uniform electrical properties and high reliability.

DETAILED DESCRIPTION OF THE PREFERRED EMBODIMENTS

The method of the present invention is designed to remove native oxide from the surface of the conductive layer formed on a low-dielectric insulating layer by heat treatment with a hydrogen-based reducing gas and plasma treatment with a reducing gas which are performed successively. The combination of the two steps prevents the insulating film from increasing in dielectric constant and receding (detrimental to uniform electric properties and reliability) which would occur if the latter plasma treatment is performed alone.

The method for production of semiconductor devices according to an embodiment of the present invention will be described with reference to one embodiment shown in FIG. 1, which is a schematic diagram not drawn to scale.

Figure 1A:
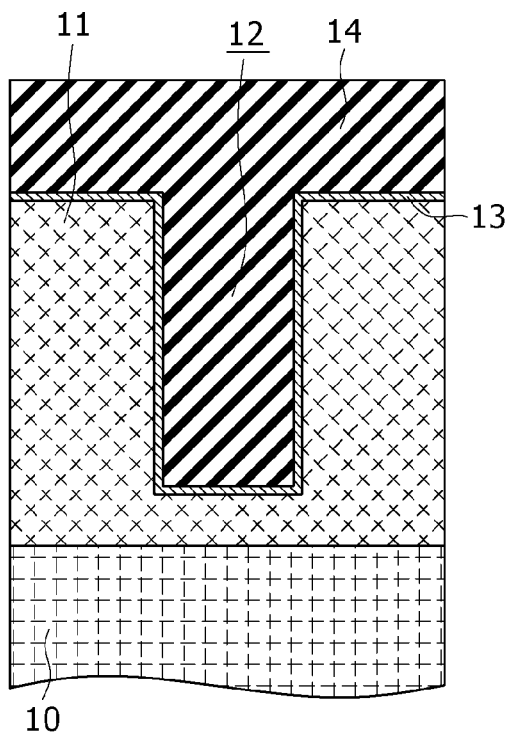
FIGS. 1A to 1E are sectional views showing one embodiment of the method for production of semiconductor devices according to an embodiment of the present invention.

In FIG. 1A, there is shown a substrate 10, which is omitted in subsequent figures. First, a groove 12 for wiring is formed in an interlayer insulating film 11 on the substrate 10. The interlayer insulating film 11 may be a low-dielectric one having a dielectric constant no higher than 3.0. Then, a barrier metal layer 13 is formed on the inside of the groove 12, with an adhesion layer (not shown) interposed between them. In this step, the adhesion layer and the barrier metal layer 13 will also cover the interlayer insulating film 11. The adhesion layer may be a tantalum (Ta) film or titanium (Ti) film with a thickness of about 5 to 10 nm. The barrier metal layer 13 may be a tantalum nitride (TaN) film or titanium nitride (TiN) film with a thickness of about 30 to 50 nm. Then, a conductive material 14 that fills the groove 12 is deposited. The conductive material 14 is one which is composed mainly of copper, such as copper. Deposition is accomplished by plating. Incidentally, copper plating is preceded by a step of forming a copper seed layer (not shown) on the inside of the groove 12 by sputtering or the like.

Figure 1C:
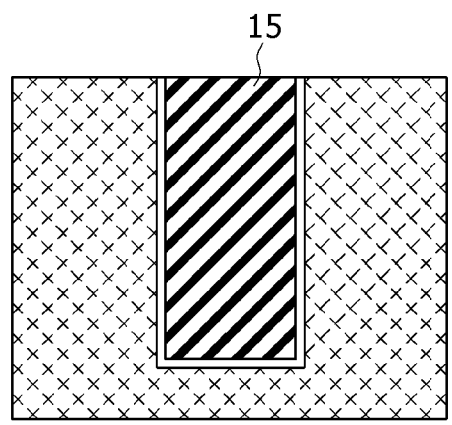
Figure 1B:
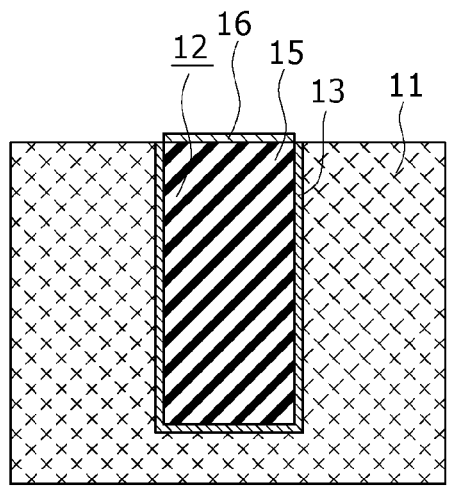

Excess portions of the conductive material 14, barrier metal layer 13, and adhesion layer (not shown) are removed from the interlayer insulating film 11, as shown in FIG. 1B. This step forms the conductive layer (wiring) 15 of the conductive material 14 on the inside of the groove 12, with the adhesion layer and barrier metal layer 13 interposed between them. The removing step may be accomplished by chemical mechanical polishing (CMP). The CMP is followed by cleaning to remove slurry from the surface. This cleaning step permits a native oxide film 16 to form on the exposed surface of the conductive layer 15.

In the next step shown in FIG. 1C, heat treatment with a hydrogen-based reducing gas is performed to remove the native oxide film 16 (shown in FIG. 1B) that has formed on the surface of the conductive layer 15. This heat treatment for reduction is hydrogen annealing, which is carried out under the following conditions.

Figure 1D:
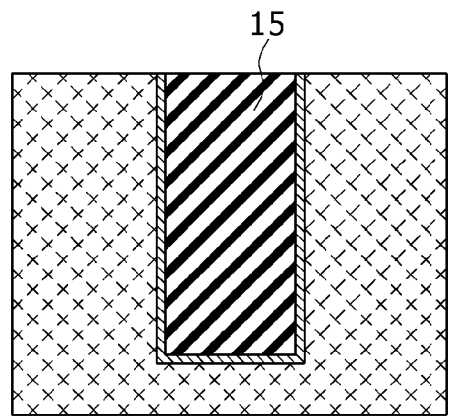

Reducing gas: composed mainly of hydrogen
Flow rate of hydrogen: 200 to 1000 $cm^3$/min
Pressure in chamber: 0.93 kPa
Substrate temperature: 300 to 400° C.
Duration of heat treatment: 20 to 60 seconds The foregoing heat treatment for reduction is followed by plasma treatment with a reducing gas which is performed on at least the exposed surface of the wiring 15, as shown in FIG. 1D. This plasma treatment should be carried out without contact with air or any other oxygen-containing atmosphere. The reducing gas for this plasma treatment may be a mixture of ammonia ($NH_3$) and nitrogen ($N_2$). The plasma treatment may be carried out under the following conditions.

Ratio of ammonia flow rate to nitrogen flow rate: 1:4
Total flow rate of ammonia and hydrogen: 2600 $cm^3$/min
Duration of plasma treatment: 5 to 15 seconds
Inductively coupled plasma: generated by application of high frequency (13.56 MHz) output (150 to 300 W)

Figure 1E:
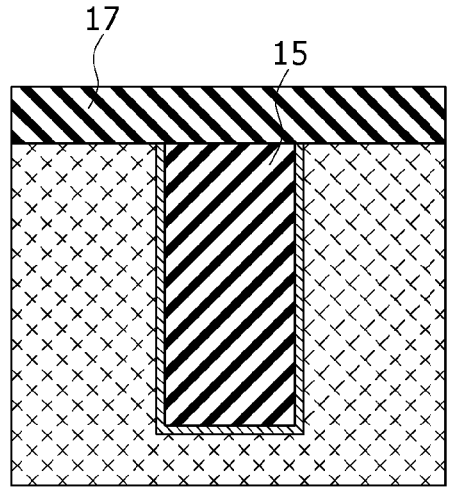

An oxidation resistance film 17, which covers the conductive layer 15, is formed on the interlayer insulating film 11, as shown in FIG. 1E. This step is accomplished by plasma CVD process in a plasma unit of multi-chamber type, which maintains a vacuum from the previous plasma treatment to the plasma CVD process, without the surface of the conductive layer 15 being exposed to any oxygen-containing atmosphere. The oxidation resistance film 17 may be a silicon nitride film.

The above-mentioned method for production of semiconductor devices includes heat treatment with hydrogen-based reducing gas, which is performed on the surface of the conductive layer 15, and subsequent plasma treatment with a reducing gas. The heat treatment removes the native oxide film 16 that has formed on the surface of the conductive layer 15. The plasma treatment removes the residual native oxide film that has remained after the previous heat treatment. Thus, the heat treatment followed by the plasma treatment does not need a large amount of heat that causes damage to the interlayer insulating film 11 and the conductive layer 15. In other words, it is not necessary for the heat treatment with hydrogen-based reducing gas to completely remove the native oxide film 16. The residual native oxide film 16 remaining on the surface of the conductive layer 15 is removed by the plasma treatment with a reducing gas. This plasma treatment also releases hydrogen which has been adsorbed in the previous heat treatment for reduction. The plasma treatment with a reducing gas takes only a very short time because the residual native oxide film 16 remaining after the heat treatment for reduction is very thin. Therefore, it does not cause the interlayer insulating film 11 with a low dielectric constant to increase in dielectric constant or to recede. The combination of two steps makes the best use of the advantages of individual steps, while minimizing their disadvantages.

The heat treatment with a reducing gas that employs no plasma can be accomplished without the interlayer insulating film having a low dielectric constant increasing in dielectric constant or receding. The plasma treatment with a reducing gas can remove native oxide film in a short time at a lower temperature than annealing treatment. It makes up for the disadvantage of the heat treatment with a reducing gas which is a long time and a high temperature required for removal of native oxide from wiring. In addition, the heat treatment for reduction which can be accomplished with a small amount of energy in a short time makes up for the disadvantage of plasma treatment which causes the interlayer insulating film to increase in dielectric constant and to recede.

As mentioned above, the method for production of semiconductor devices according to an embodiment of the present invention involves heat treatment with a reducing gas composed mainly of hydrogen and plasma treatment with a reducing gas. The two steps combined together completely remove native oxide, without individual steps working harsh. Removal of native oxide in this manner prevents the interlayer insulating film 11 from increasing in dielectric constant and from receding. In addition, plasma treatment with a reducing gas releases hydrogen which has entered the conductive layer (wiring) 15 or the interlayer insulating film 11 during heat treatment with a hydrogen-based reducing gas. This leads to a decrease in leakage current between wirings. The method of the present invention gives semiconductor devices with uniform electrical properties and high reliability.

The effect of the heat treatment and plasma treatment mentioned above was examined by measuring the change in refractive index of the interlayer insulating film. The result is shown in FIG. 2, with the ordinate representing the change in refractive index and the abscissa representing the mode of treatment.

Figure 2:
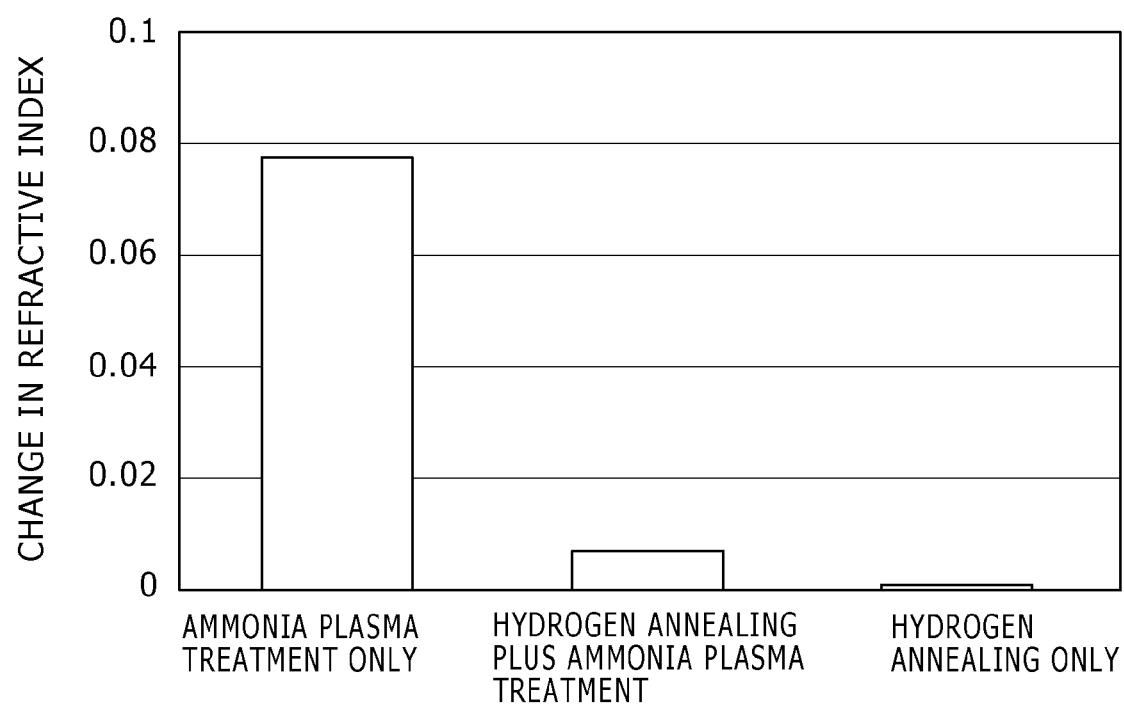
FIG. 2 is a diagram showing the relation between the change in refractive index of the interlayer insulating film (ordinate) and the method of treatment (abscissa). This data is based on the measurement of film thickness with ultraviolet light.

It is noted from FIG. 2 that the insulating film which has undergone plasma treatment with ammonia changes in refractive index. In other words, it is noted that the plasma treatment to remove the native oxide film after the wiring has been made changes the quality of the interlayer insulating film. On the other hand, the annealing treatment with hydrogen does not change at all the interlayer insulating film in refractive index. And it is also noted that the combination of hydrogen annealing treatment and ammonia plasma treatment changes the quality of the interlayer insulating film only slightly.

Figure 3:
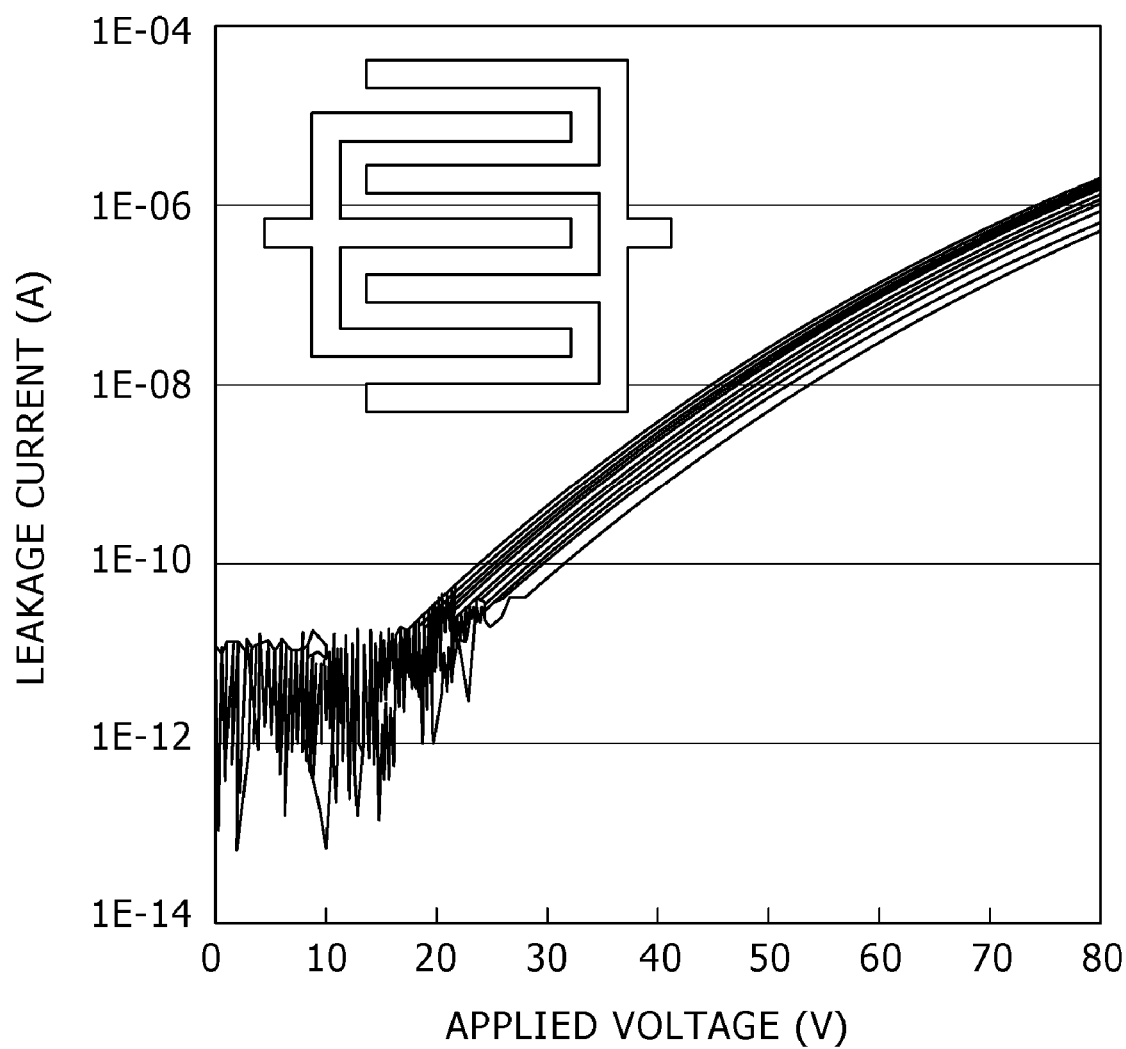
FIG. 3 is a diagram showing the relation between leakage current and applied voltage, in the case of hydrogen annealing.

The annealing treatment with hydrogen does not change the quality of the interlayer insulating film as mentioned above. However, it needs a high substrate temperature (say 300 to 500° C.) and a long time (say 2 to 200 min) because it is weaker in reducing native oxide film than the plasma treatment in the past. Annealing at such a high temperature for such a long time tends to aversely affect the wiring reliability when performed on the copper-based wiring which has been exposed after CMP. If the hydrogen annealing is carried out at a reduced substrate temperature of 400° C. for a reduced duration of 20 to 60 seconds in order to eliminate the adverse effect on the wiring reliability, the resulting device has a high leakage current between wirings on account of hydrogen which has diffused into the wiring and the interlayer insulating film. This is shown in FIG. 3 in which leakage current (ordinate) is plotted against applied voltage (abscissa). It is noted from FIG. 3 that hydrogen which has diffused into the wiring and interlayer insulating film increases leakage current between wirings to about $1 \times 10^{-8}$ A=10 nA at an applied voltage of 50 V. This suggests that reduction by hydrogen annealing alone results in an increase of leakage current between wirings. Incidentally, leakage current between wiring was measured by using a comb-shaped test pattern shown in the figure.

The same test as mentioned above was performed on a sample which had undergone hydrogen annealing and ammonia plasma treatment. The result is shown in FIG. 4 in terms of relation between leakage current and applied voltage.

Figure 4:
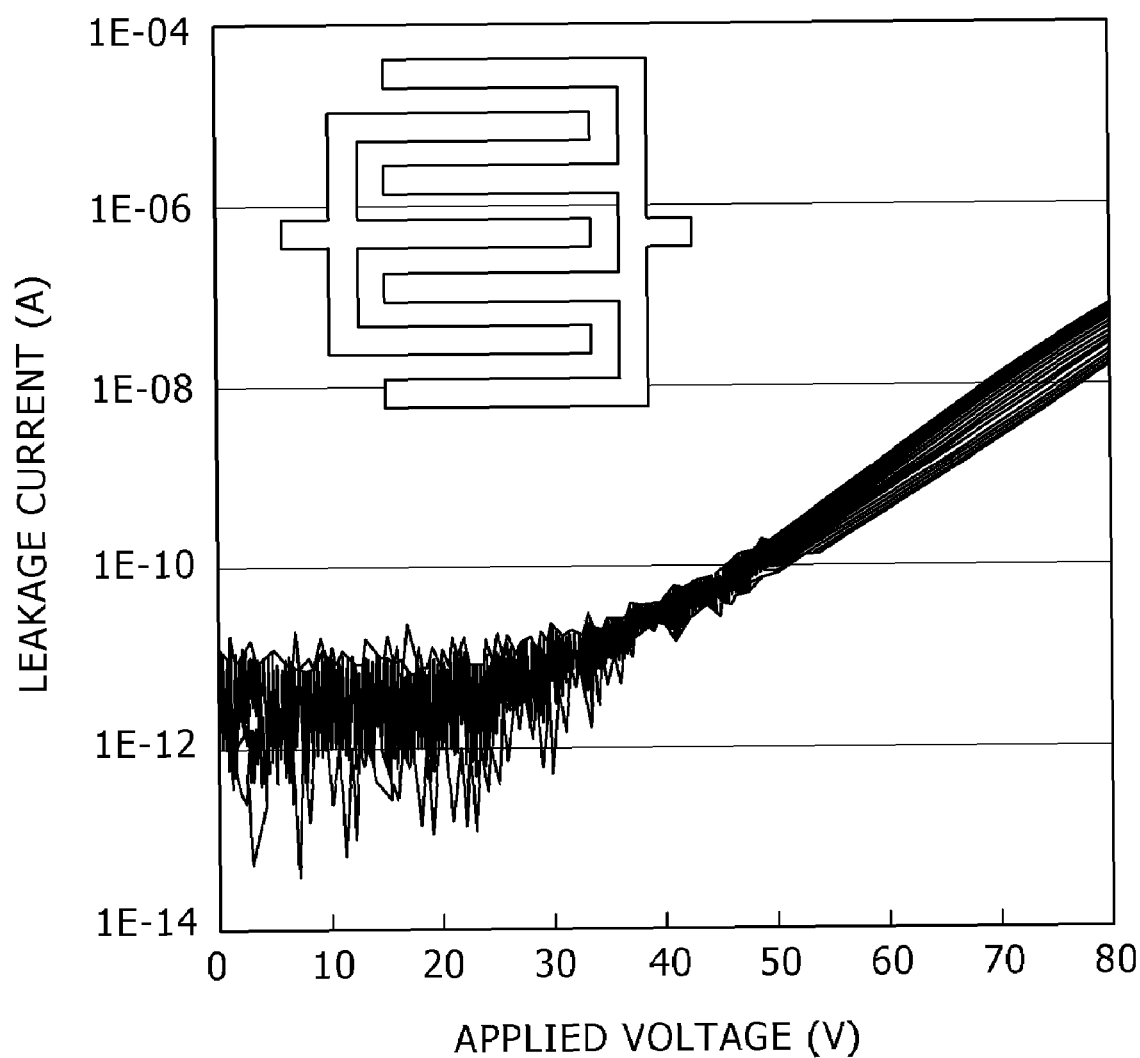
FIG. 4 is a diagram showing the relation between leakage current and applied voltage, in the case of hydrogen annealing and ammonia plasma treatment in combination.

It is noted from FIG. 4 that the combination of hydrogen annealing and ammonia plasma treatment results in a decrease in leakage current between wirings to about $1 \times 10^{-10}$ A (=0.1 nA) at an applied voltage of 50 V, which is lower by two orders of magnitude than the previous experiment with hydrogen annealing only. Incidentally, leakage current between wirings was measured by using a comb-shaped test pattern shown in the figure.

As mentioned above with reference to FIGS. 3 and 4, the method of the present invention yields semiconductor devices having a greatly reduced leakage current owing to the combined use of hydrogen annealing and ammonia plasma treatment. The reason for this is that the ammonia plasma treatment releases hydrogen which has diffused into the wiring and interlayer insulating film. In addition, the ammonia plasma treatment complements the short hydrogen annealing whose reducing action is insufficient to completely remove native oxide film. The ammonia plasma treatment that follows the hydrogen annealing should be limited in duration and power as far as possible for the reasons mentioned above.

A few samples of interlayer insulating film 11 differing in dielectric constant were examined for damage caused by the above-mentioned plasma treatment for reduction. The interlayer insulating film 11 is that of silicon carbide oxide (SiOC) which has a low dielectric constant. The plasma is generated in a mixture gas of ammonia and nitrogen. The results are shown in FIG. 5, with the ordinate representing the change in refractive index and the abscissa representing the duration of plasma irradiation.

Figure 5:
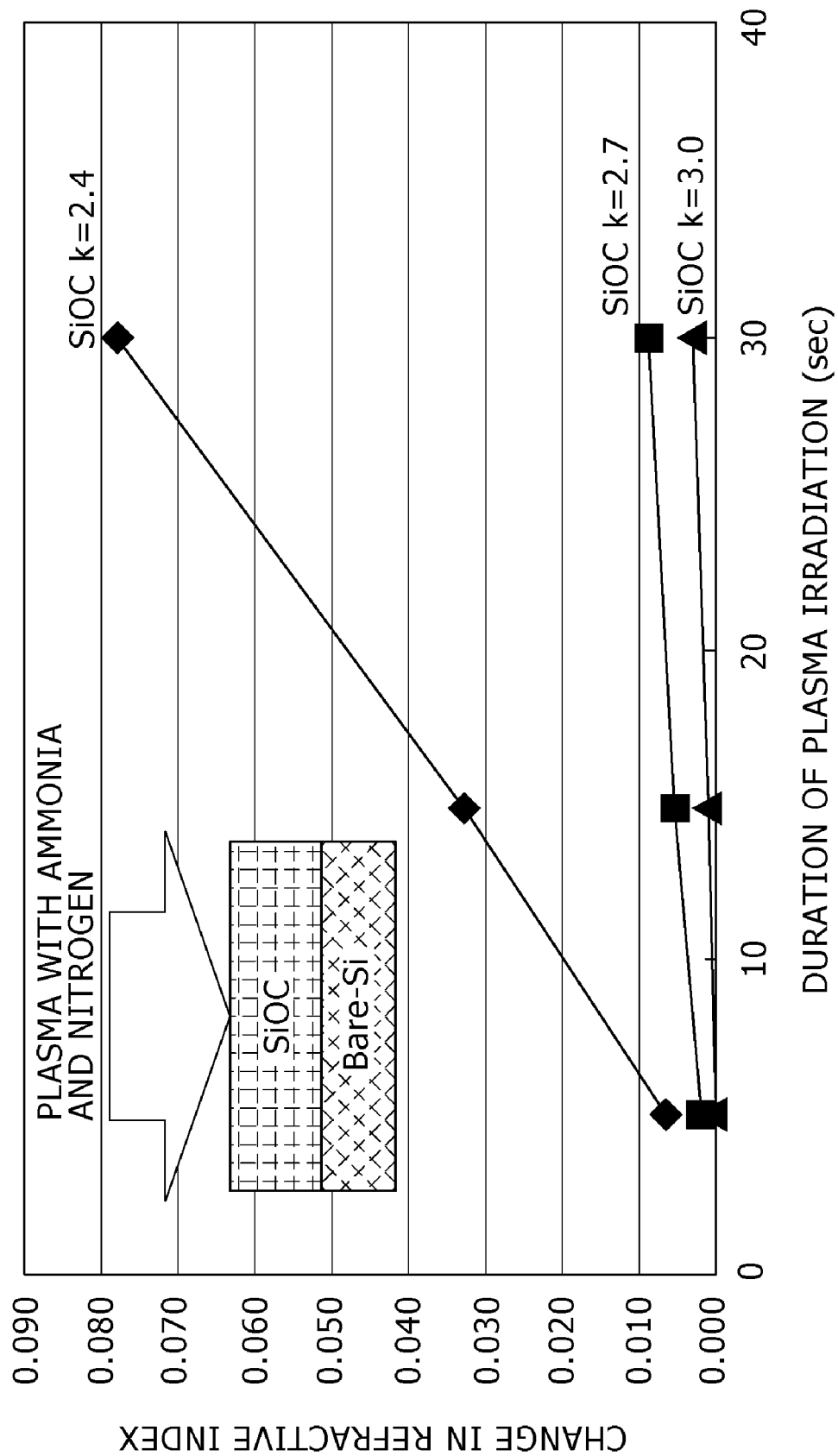
FIG. 5 is a diagram showing the relation between the change in refractive index of the interlayer insulating film and the duration of plasma irradiation, with the refractive index depending on the dielectric constant.

It is noted from FIG. 5 that the SiOC film having a low dielectric constant of about 3.0 or 2.7 changes very little in refractive index and hence suffers very little damage after plasma treatment for about 30 seconds. By contrast, it is also noted from FIG. 5 that the SiOC film having a lower dielectric constant of about 2.4 greatly changes in refractive index and hence suffers serious damage in proportion to the duration of plasma treatment. These results suggest that the plasma treatment with a reducing gas should preferably be as short as possible although it varies depending on the kind of the interlayer insulating film 11, the kind of the plasma, and the intensity of the plasma.

Incidentally, the above-mentioned annealing with hydrogen does not serve to recrystallize copper, which has been filled into the groove 12 formed in the interlayer insulating film 11, to form the conductive layer (or copper layer) 15. Annealing for recrystallization is performed separately under different conditions.

It should be understood by those skilled in the art that various modifications, combinations, sub-combinations and alterations may occur depending on design requirements and other factors insofar as they are within the scope of the appended claims or the equivalents thereof.

What is claimed is:

1. A method for production of semiconductor devices comprising the steps of:
    forming, on an interlayer insulating film formed on a substrate, a copper-containing conductive layer in such a way that its surface is exposed;
    performing a two step removal process including the steps of (1) performing a heat treatment with a reducing gas composed mainly of hydrogen on the surface of said conductive layer with sufficient heat to remove some of a film from the surface of the copper-containing conductive layer and (2) directly following the heat treatment process performing plasma treatment with a reducing gas on the surface of said conductive layer to effectively remove film remaining on the surface of the copper-containing conductive layer after the heat treatment step, thereby permitting the surface of said conductive layer to be reduced and the hydrogen adsorbed by said heat treatment to be released; and
    forming an oxidation resistance film that covers the surface of said conductive layer such that the surface of said conductive layer is not exposed to an oxygen-containing atmospheric gas after said plasma treatment,
    wherein,
        the plasma treatment with the reducing gas employs a mixture gas of ammonia and nitrogen which is effective to release hydrogen diffused into the copper-containing conductive layer and interlayer insulating film, and
        the heat treatment with a reducing gas composed mainly of hydrogen and the plasma treatment are carried out successively without the substrate being exposed to an oxygen-containing atmosphere.

2. The method for production of semiconductor devices as defined in claim 1, wherein the interlayer insulating film has a low dielectric constant.

3. The method for production of semiconductor devices as defined in claim 1, wherein the heat treatment with a reducing gas composed mainly of hydrogen is hydrogen annealing.

* * * * *